United States Patent [19]
Wohlers

[11] 3,997,843
[45] Dec. 14, 1976

[54] MONOCYCLE PULSE GENERATOR
[75] Inventor: Robert J. Wohlers, Orchard Park, N.Y.
[73] Assignee: Calspan Corporation, Buffalo, N.Y.
[22] Filed: June 20, 1975
[21] Appl. No.: 588,756
[52] U.S. Cl. ............... 325/105; 307/268; 328/67
[51] Int. Cl.² .......................... H04B 1/04
[58] Field of Search ............. 328/67, 66; 307/268; 325/105

[56] References Cited
UNITED STATES PATENTS

| 3,122,648 | 2/1964 | Rufer | 328/67 |
| 3,141,111 | 7/1964 | Godlove | 328/67 |
| 3,383,526 | 5/1968 | Berding | 328/67 |
| 3,405,287 | 10/1968 | Miller | 328/67 |
| 3,849,732 | 11/1974 | Pezot | 328/67 |

Primary Examiner—Marshall M. Curtis
Attorney, Agent, or Firm—Allen J. Jaffe; David J. Zobkiw

[57] ABSTRACT

The radio frequency source for a low power, lightweight radar is provided by operating a transistor in the avalanche mode. An open delay line is in the collector circuit and a shorted delay line in shunt with the output line is part of the emitter load. The resulting device can be employed as a low power, nanosecond, monocycle pulse generator with low range, or time domain, sidelobes.

2 Claims, 3 Drawing Figures

U.S. Patent    Dec. 14, 1976    3,997,843
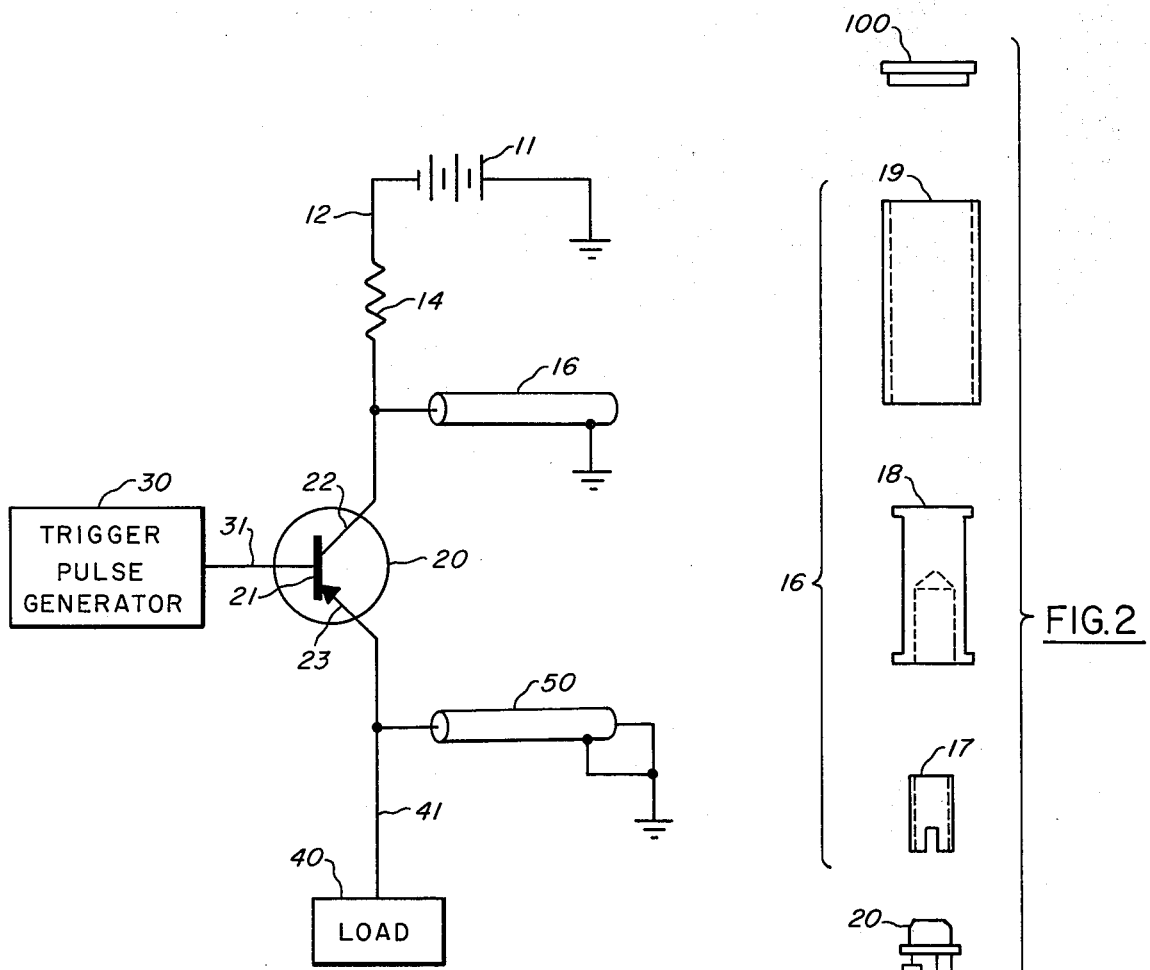
FIG.1
FIG.2
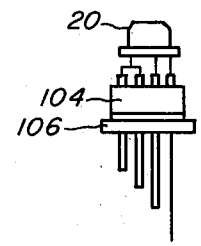
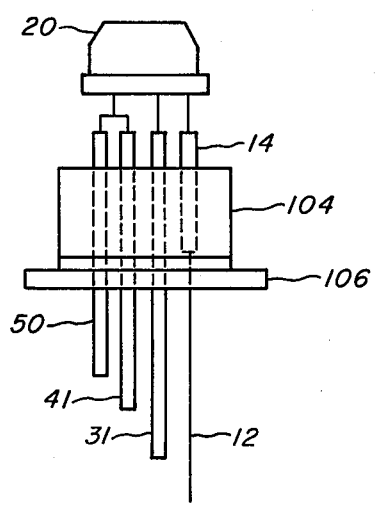
FIG.3

MONOCYCLE PULSE GENERATOR

The invention herein described was made in the course of or under a contract with the Department of the Army.

The present invention is directed to a device suitable for use as a radio frequency source for low power, lightweight radars such as that disclosed in application Ser. No. 504,571 filed Sept. 9, 1974, abandoned and refiled as application Ser. No. 659,883 on Feb. 20, 1976, and assigned to a common assignee. This type of monocycle pulse generator has extremely low range, or time domain, sidelobes, smaller than −40 db of the main pulse, and has a low power consumption thereby making it an attractive device for battery powered systems.

It is an object of this invention to provide a monocycle pulse generator having extremely low range, or time domain, sidelobes.

It is a further object of this invention to provide a portable, battery powered, monocycle pulse generator.

It is an additional object of this invention to provide a monocycle pulse generator operable at 1 GHz.

It is a still further object of this invention to provide a monocycle radio frequency pulse generator employing a solid state source and coaxial construction. These objects, and others as will become apparent hereinafter, are accomplished by the present invention.

According to the present invention, a transistor is employed in the avalanche mode, with an essentially open delay line as the collector load and a shorted delay line in shunt with the output line as the emitter load. The base of the transistor is biased below cutoff, even though the transistor is slightly conducting because it is operating beyond collector-emitter breakdown voltage.

BRIEF DESCRIPTION OF THE DRAWINGS

For a fuller understanding of the present invention, reference should now be had to the following detailed description thereof taken in conjunction with the accompanying drawings wherein:

FIG. 1 is a circuit diagram of the short pulse generator;

FIG. 2 is an exploded view of the short pulse generator; and

FIG. 3 is an enlarged view of a portion of the short pulse generator.

DESCRIPTION OF THE PREFERRED EMBODIMENT

In FIGS. 1 and 2, the numeral 20 generally designates a transistor having a base 21, a collector 22 and an emitter 23. Transistor 20 is connected to a DC power source 11 via line 12 containing dropping resistor 14. Connected to line 12 intermediate dropping resistor 14 and collector 22 is open circuit delay line 16 which is the collector load and which physically comprises an inner conductor 17 separated from a coaxial outer conductor 19 by a dielectric spool 18. Base 21 is connected to a trigger pulse generator 30 via coaxial input line 31. Load 40, which may be the radar system of the above-identified application, is connected to emitter 23 via line 41. Connected to line 41 intermediate emitter 23 and load 40 is shorted delay line in shunt 50 which is the emitter load and which physically consists of a conductive wire located coaxially within a surrounding conductive tube and having a soldered interconnection at one end of the tube.

Referring to FIG. 2 which shows the assembly of the monocycle generator, end cap 100 is inserted, with a press fit, into one end of coaxial outer conductor 19 to provide a controlled electrical circuit and to shield the interior from environmental effects. Dielectric spool 18 supports inner conductor 17 of open circuit delay line 16 while also controlling the characteristic impedance and propagation velocity of delay line 16. Inner conductor 17 provides pulse timing by the proper selection of its length. As best shown in FIG. 3, dielectric support member 104 provides support for transistor 20 and dropping resistor 14. End cap 106 provides support and location for coaxial input line 31, line 41 and line 50. The outer conductors of coaxial lines 31, 41 and 50 are soldered to end cap 106 at holes suitably provided. End cap 106 is press fit into coaxial outer conductor 19 to coact together with end cap 100 to shield the members located within the interior of conductor 19 from the external environment.

OPERATION

Base 21 of the transistor 20 is biased below cutoff by power source 11, even though transistor 20 is slightly conducting because it is operating beyond collector-emitter breakdown voltage. Dropping resistor 14 is located between power source 11 and transistor 20 and is employed to limit the collector-emitter current during the off condition of transistor 20. The transistor collector-emitter voltage exceeds the collector-emitter breakdown voltage so without current limiting, transistor 20 would destroy itself. As a result, a trigger pulse supplied to base 21 by trigger pulse generator 30 causes the transistor 20 to avalanche, with a large surge of current flowing from open delay line 16 (and arising from the charge standing on the delay line 16) to the emitter output which is supplied to output line 41. Collector 22 and emitter 23 are then essentially short circuited. Current flow from open delay line 16 causes the collector voltage to drop by an amount controlled by the impedance of the delay line 16. That is, $$V_D = I_{CE} Z_C$$

where
$V_D$ is the voltage drop on delay line 16,
$I_{CE}$ is the collector-emitter current, and
$Z_C$ is the characteristic impedance of delay line 16

This voltage drop proceeds down the delay line 16 until it hits the end where it is reflected with an essentially unity reflection coefficient. As a consequence, after a time corresponding to twice the length of delay line 16, the total distance the voltage drop must travel, the collector voltage drops to twice $V_D$ and cuts off current flow through the transistor 20.

In the meantime, initial current out of the emitter 23 feeds the output line 41 and the shorted delay line 50. The voltage generated at the junction of lines 41 and 50 proceeds to the load 40 and down shorted delay line 50. In the case of shorted delay line 50, after the voltage reaches the short, it is reversed in polarity and proceeds back toward transistor 20. However, by the time the reflected signal reaches the junction of lines 41 and 50, transistor 20 has been turned off by the collector pulse. As a consequence, the emitter 23 is essentially "open" (infinite impedance) and the negative pulse proceeds down output line 41. Since the output line 41 and the shorted delay line 50 are of the same characteristic impedance, no reflection takes place and the negative going pulse therefore is transmitted without range sidelobes.

Although a preferred embodiment of the present invention has been illustrated and described, other changes will occur to those skilled in the art. It is therefore intended that the scope of the present invention is to be limited only by the scope of the appended claims.

I claim:

1. A monocycle radio frequency pulse generator means including:

transistor means having a base, collector and emitter;

DC power source means connected to said collector to bias said base below cutoff;

dropping resistor means located intermediate said DC power source means and said collector to limit collector-emitter current during the off condition of said transistor;

open circuit delay line means located intermediate said dropping resistor means and said collector to define the collector load;

trigger pulse generator means connected to said base for supplying a trigger pulse to said base and to cause said transistor to avalanche with a large surge of current coming from said open circuit delay line means to said emitter;

means for receiving a radio frequency pulse connected by an outlet line to said emitter;

shorted delay line means in shunt with said outlet line and defining the emitter load.

2. The monocycle radio frequency pulse generator means of claim 1 wherein said open circuit delay line means includes inner and outer coaxial conductors separated by a dielectric.

* * * * *